United States Patent [19]
Grivna et al.

[11] Patent Number: 5,733,806
[45] Date of Patent: Mar. 31, 1998

[54] METHOD FOR FORMING A SELF-ALIGNED SEMICONDUCTOR DEVICE

[75] Inventors: Gordon M. Grivna, Mesa; Karl J. Johnson, Scottsdale, both of Ariz.

[73] Assignee: Motorola, Inc., Schaumburg, Ill.

[21] Appl. No.: 523,705

[22] Filed: Sep. 5, 1995

[51] Int. Cl.$^6$ .................... H01L 21/338; H01L 21/28; H01L 21/44
[52] U.S. Cl. ........................... 438/183; 438/577
[58] Field of Search .................. 437/39, 40 R, 437/40 RG, 40 SH, 41 R, 41 RG, 41 SH, 175, 176, 177, 912, 41 GS, 29; 257/471, 472, 473, 486; 438/183, 577

[56] References Cited

U.S. PATENT DOCUMENTS

| | | | |
|---|---|---|---|
| 4,503,599 | 3/1985 | Ueyanagi et al. | 438/183 |
| 4,553,316 | 11/1985 | Houston et al. | 437/39 |
| 4,745,082 | 5/1988 | Kwok . | |
| 4,792,531 | 12/1988 | Kakihana | 437/41 SH |
| 4,843,024 | 6/1989 | Ito | 437/39 |
| 4,859,618 | 8/1989 | Shikata et al. | 437/912 |
| 4,863,879 | 9/1989 | Kwok . | |
| 4,892,835 | 1/1990 | Rabinzohn et al. | 437/41 SH |
| 4,963,501 | 10/1990 | Ryan et al. | 437/39 |
| 5,387,548 | 2/1995 | Cho . | |
| 5,389,564 | 2/1995 | Bernhardt et al. . | |
| 5,445,997 | 8/1995 | Fujimoto | 437/40 SH |
| 5,447,874 | 9/1995 | Grivna et al. | 437/912 |
| 5,484,740 | 1/1996 | Cho | 437/39 |

*Primary Examiner*—John Niebling
*Assistant Examiner*—Brian K. Dutton
*Attorney, Agent, or Firm*—Daniel R. Collopy; Vincent B. Ingrassia

[57] ABSTRACT

A method for forming a self-aligned semiconductor device (10) having sidewall spacers (16,17) used to align the formation of a source region (23) and a drain region (24) along with the formation of a gate structure (35). Spacers (16,17) can be formed using a sacrificial structure process where a sacrificial structure (14) is formed which determines the location of a final gate structure (35). The deposition of a dielectric layer over the sacrificial structure (14) and subsequent etch will form spacers (16,17). A second method for forming spacers (18,19), uses a photolithographic process to pattern a dielectric layer without the use of a sacrificial structure process. The spacers (16,17) are used in conjunction with implant mask regions (22) to form the source and drain regions (23,24) which are aligned to the gate structure (35). The spacers (16,17) are also used to form the gate structure (35) in conjunction with the deposition of a refractory metal layer (32) and a metal layer (33) followed by a Reactive Ion Etch.

18 Claims, 3 Drawing Sheets

METHOD FOR FORMING A SELF-ALIGNED SEMICONDUCTOR DEVICE

BACKGROUND OF THE INVENTION

The present invention relates, in general, to semiconductor devices, and more particularly, to spacer formation for a self-aligned semiconductor device.

Increasing demand for improved performance in semiconductor devices has pushed the technology to ever decreasing geometry sizes. As device geometries, such as gate length, continue to shrink, there is increased pressure on the manufacturing techniques to have tighter tolerances for each device and process parameter. To reduce the impact pattern alignment variations have on device performance, previously known techniques have relied upon a self-aligned gate process.

Briefly, a self-aligned gate process uses either a gate structure with dielectric spacers or a substitutional gate structure in conjunction with dielectric spacers to define the source and drain regions of a transistor and/or align source and drain metal contacts to a gate contact. In some embodiments of the substitutional gate process, these previously known methods remove the spacers and expose the top surface of the substitutional gate through blanket photoresist coat and etchback. At this point the substitutional gate is removed through selective etching and a lift-off process is used to form a final gate structure. The use of a lift-off process, however, increases the number of process steps required which increases the final cost of the semiconductor device, limits the minimum gate length achievable, and is considered a "dirty" process which can reduce the yield of high density circuits.

Other self-aligned processes form the gate metal with spacers prior to the implantation of the source and drain regions and the formation of ohmic contacts. During subsequent process steps, the gate metal will under go high temperature thermal cycling which will cause the gate metal material to diffuse into the substrate and degrade the device.

Accordingly, it would be advantageous to have a method for forming a semiconductor device that does not require the use of a substitutional gate or a gate lift-off process. Such a method would increase device scaleability, improve cleanliness, and reduce the number of process steps required to make the final device which would reduce its subsequent manufacturing cost. It would be of a further advantage if the method was not only self-aligned for the formation of the source and drain regions, but for the formation of the final gate structure as well. It would be of even further advantage if such a method could offer the option of forming a final gate structure after the formation of ohmic contacts to the source and drain regions to prevent diffusion of the gate material into the semiconductor substrate.

DETAILED DESCRIPTION OF THE DRAWINGS

The present invention provides two embodiments for a process for forming a self-aligned semiconductor device with sidewall spacers which are used for simultaneously defining a source region and a drain region and a final gate structure. A first embodiment is a process similar to a substitutional gate method to form sidewall spacers, however, a sacrificial structure defines the location of the spacers and not necessarily the location of the gate structure. A second embodiment forms sidewall spacers from a single layer of dielectric material using a photolithographic and etch process. Regardless of which method is used to form the spacers, the present invention provides a self-aligned process that improves device performance and does not require the use of a lift-off process for the final gate formation.

Figure 1:
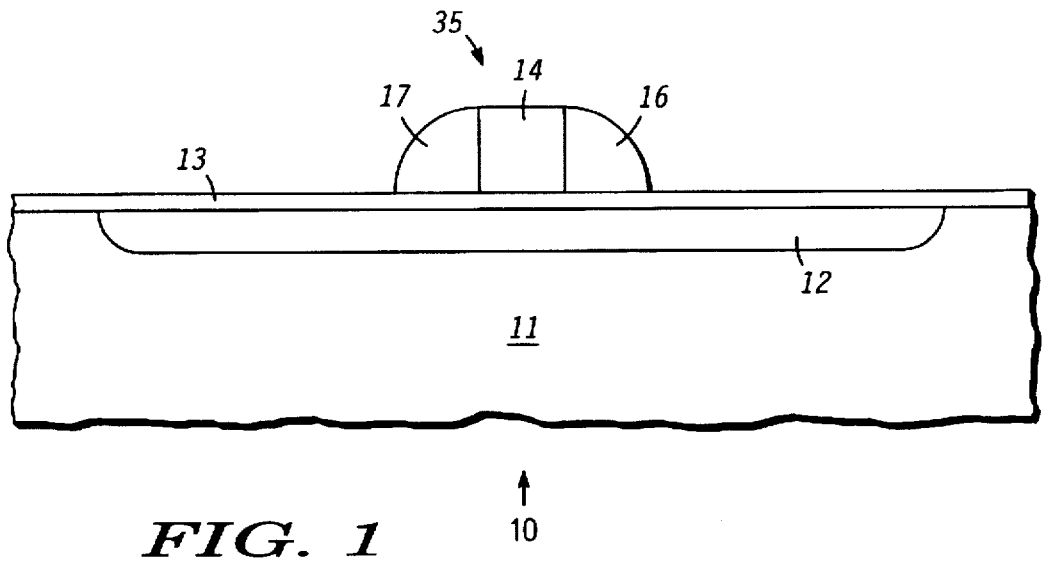
FIG. 1 is an enlarged cross-sectional view of a semiconductor device according to a first embodiment of the present invention in the early stages of fabrication.

FIG. 1 is an enlarged cross-sectional view of a semiconductor device 10 according to the first embodiment of the present invention. Semiconductor device 10 is formed in a body of semiconductor material or semiconductor substrate 11. It will be understood that the preferred embodiment forms semiconductor device 10 in a gallium arsenide substrate 11, however, the teachings and embodiments of the present invention are also applicable to devices formed in substrates formed with other III–V or II–VI compounds and the like. A first dielectric layer 13, using either aluminum nitride, silicon dioxide, silicon nitride, or other dielectric, is formed on substrate 11 to be 100 angstroms to 1000 angstroms thick. First dielectric layer 13 will retard the out diffusion of arsenic from substrate 11 during high temperature process steps, and serve as a contamination barrier to retard impurities such as sulfur, copper, fluorine, hydrogen, chromium, and the like from contaminating substrate 11 during subsequent process steps. Using first dielectric layer 13 as an implant screen, a channel region 12 is formed by implanting substrate 11 with either a p-type or a n-type dopant.

In the first embodiment, a process similar to a substitutional gate process is used to form spacers 16 and 17. Spacers 16 and 17 can be formed either interior to a gate region 35 or exterior to gate region 35. A 4000 angstrom thick layer of silicon nitride is formed on first dielectric layer 13 which is selectively patterned and etched to form sacrificial structure 14. Spacers 16 and 17 are formed on the exterior and adjacent to the sides of sacrificial structure 14 by forming a second dielectric layer, such as silicon dioxide which is generally 2000 angstroms to 6000 angstroms thick, over sacrificial structure 14. The second dielectric layer is then etched using an anisotropic Reactive ion Etch (RIE), leaving silicon dioxide juxtaposed to the sides of sacrificial structure 14 thereby forming spacers 16 and 17. The width of spacers 16 and 17, which help determine the location of a source region 23 and a drain region 24 (see FIG. 4), can be controlled by the thickness of the second dielectric layer and the amount of over-etch used to form spacers 16 and 17.

Figure 2:
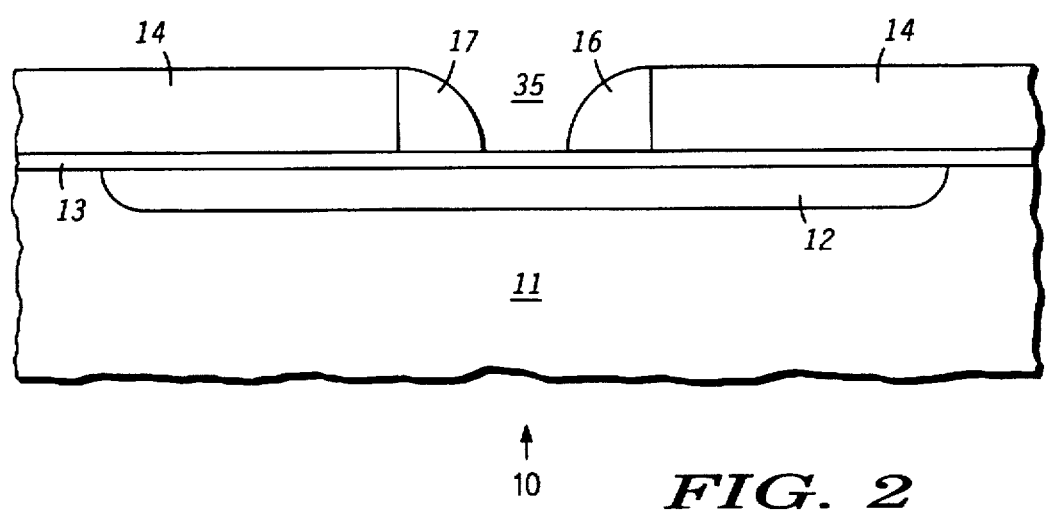
FIG. 2 is an enlarged cross-sectional view of a semiconductor device according to a first embodiment of the present invention in the early stages of fabrication.

Spacers 16 and 17 can be as small as 0.1 μm and the distance between spacers 16 and 17, which defines the location of gate region 35, is only limited to the capability of the process steps which form sacrificial structure 14. FIG. 2 shows an example of forming spacers 16 and 17 to the interior of sacrificial structures 14. Since spacers 16 and 17 are formed in the narrow opening made by sacrificial structures 14, this method allows the formation of gate lengths beyond the capabilities of the photo tools used to pattern the silicon nitride layer. After the formation of spacers 16 and 17, sacrificial structure 14 is etched away such as by using a selective downstream plasma etcher. The layer of silicon nitride and the second dielectric layer can be formed or deposited by many techniques such as with a Plasma Enhanced Chemical Vapor Deposition (PECVD) system at 200° C. to 400° C. Silicon dioxide can be formed using tetraethylorthosilicate (TEOS) and silicon nitride can be formed using the reaction of silane with ammonia.

Figure 3:
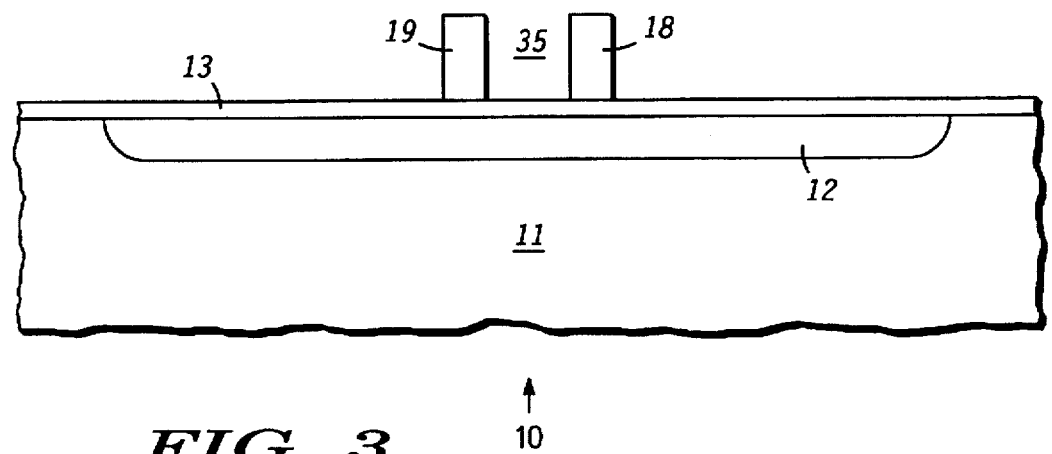
FIG. 3 is an enlarged cross-sectional view of a semiconductor device according to a second embodiment of the present invention in the early stages of fabrication.

FIG. 3 is an enlarged cross-sectional view of semiconductor device 10 according to the second embodiment of the present invention in the early stages of fabrication. Spacers 18 and 19 are formed by a third dielectric layer of silicon dioxide formed on first dielectric layer 13. The thickness of the third dielectric layer is equal the final height of spacers 18 and 19 and is generally 2000 angstroms to 6000 angstroms thick over first dielectric layer 13. A photoresist layer, which has been exposed and developed, or a hard etch block mask, such as aluminum nitride or silicon nitride, is formed over the third dielectric layer and patterned to define the location of spacers 18 and 19. Portions of the third dielectric layer are then removed with a RIE such that portions protected by the etch block layer remain to form spacers 18 and 19. Spacers 18 and 19 can be as small as 0.1 µm and the distance between spacers 18 and 19 defines gate region 35 which is only limited to the capability of the photolithographic process used.

Figure 4:
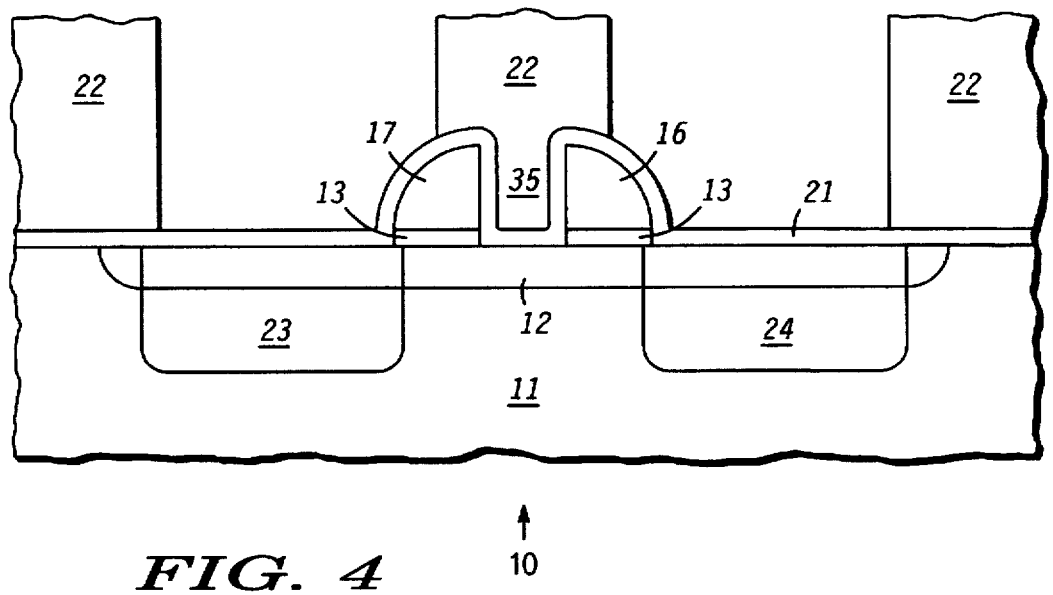
FIGS. 4-6 are enlarged cross-sectional views of a semiconductor device according to the first embodiment of the present invention at various stages of fabrication.

FIG. 4 is an enlarged cross-sectional view of self-aligned semiconductor device 10 according to the first embodiment of the present invention after further processing. After forming spacers 16 and 17, first dielectric layer 13 is removed to prevent any problems with first dielectric layer 13 peeling during Rapid Thermal Annealing (RTA) steps to follow. Note that in the preferred embodiment, aluminum nitride, which has been formed by sputtering aluminum in a nitrogen ambient, is used to form first dielectric layer 13 and portions of aluminum nitride remain under spacers 16 and 17. First dielectric layer 13, made from aluminum nitride, can be etched such as with a wet etch employing ammonium hydroxide. The presence of the aluminum nitride under spacers 16 and 17 provides an unexpected improvement in device performance. Semiconductor device 10, using aluminum nitride as the first dielectric layer 13, has reduced leakage current and a breakdown voltage that is twice that of a semiconductor device that uses silicon nitride for first dielectric layer 13.

An implant screen 21, using 200 angstroms to 500 angstroms of silicon nitride, is formed on substrate 11. implant screen 21 retards the out diffusion of arsenic from substrate 11 and protects substrate 11 from contamination during the following implant process. The pattern for source region 23 and drain region 24 is defined using a photoresist and masking step to form implant mask regions 22. Only the exposed portions of implant screen 21 will allow dopant to enter substrate 11. The dopant used to form source region 23 and drain region 24 is of the same conductivity as the dopant used to form channel region 12. Note that an implant mask region 22 in gate region 35 protects substrate 11 from being doped in this region. After the implantation step, implant mask regions 22 are removed to allow further processing of semiconductor device 10.

Figure 5:
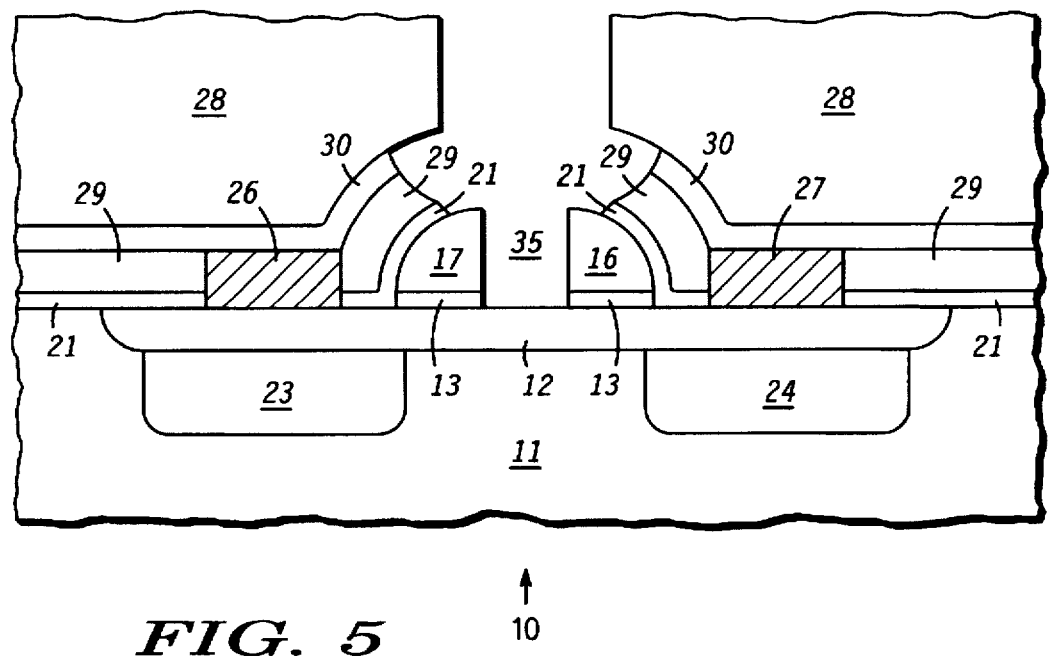

FIG. 5 is an enlarged cross-sectional view of semiconductor device 10 according to the first embodiment of the present invention after further processing. A first inter-level dielectric layer 29 (ILD) is formed on implant screen 21. First inter-level dielectric layer 29 is made from silicon dioxide which is 500 angstroms to 2000 angstroms thick. Using a photolithographic pattern and wet etch process using hydrofluoric acid, openings are made in first inter-level dielectric layer 29 to expose portions of source region 23 and drain region 24. Using either a liftoff or photoresist and etching technique known in the art, ohmic contact regions 26 and 27 are made to source region 23 and drain region 24 respectively. Methods for forming ohmic contact regions 26 and 27 were taught is U.S. Pat. Nos. 5,389,564 which issued to Bernhardt et al. on Feb. 14, 1995 and 5,387,548 which issued to Cho on Feb. 7, 1995, both of which are hereby incorporated by reference.

A second inter-level dielectric layer 30 is then formed overlying first inter-level dielectric layer 29 to insulate future overlying conductive layers in semiconductor device 10. A photoresist pattern 28 is then formed on second inter-level dielectric layer 30 to expose gate region 35. Using wet etches of a diluted solution of hydrofluoric acid, second inter-level dielectric layer 30 and first inter-level dielectric layer 29 are removed from gate region 35. Photoresist pattern 28 is removed and a downstream RIE etch is used to selectively remove implant screen 21 and expose the surface of substrate 11.

One significant advantage with the present invention is the self-aligned method used to form the opening for gate region 35. Even if photoresist pattern 28 is not properly aligned between the two spacers 16 and 17, the combination of the selectivity in etch rate between the various layers and the size of spacers 16 and 17 will insure that the proper opening is made for gate structure 35. This self-aligned nature of the present invention allows this method to be scaled down to form semiconductor devices with smaller gate lengths than could be formed with some previously known methods.

Figure 6:
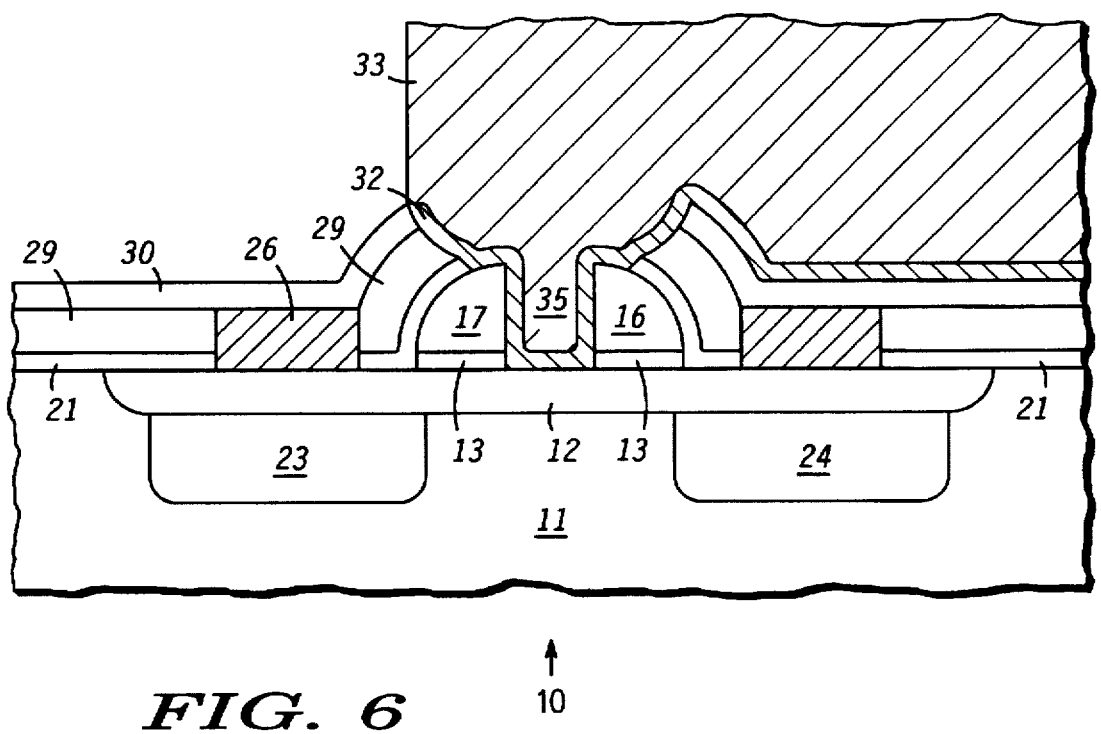

FIG. 6 is an enlarged cross-sectional view of semiconductor device 10 according to the first embodiment of the present invention after further processing. Second inter-level dielectric layer 30 is covered with a refractory metal layer 32 which comprises titanium tungsten nitride (TiWN) that is typically 1000 angstroms thick. A metal layer 33 of approximately 6000 angstroms of aluminum copper is formed on refractory metal layer 32. A photoresist mask is formed on metal layer 33 to define gate structure 35 and any corresponding gate metal interconnect. Both metal layer 33 and refractory metal layer 32 are then etched using a RIE process. Since spacers 16 and 17 are used to aligned the formation of gate structure 35, a clean RIE process can be used to pattern metal layer 33 and refractory metal layer 32.

The present invention therefore provides the option of forming gate structure 35 without the use of a lift-off process. The lift-off process is known to be dirty compared to a RIE process, therefore the present invention will reduce the defect density of the over all process. If necessary, however, a lift-off process can be used to form gate structure 35 by forming a lift-off layer overlying substrate 11, removing the portion of the lift-off layer in gate region 35, depositing a conductive layer over the lift-off layer, and removing the lift-off layer thereby leaving a portion of the conductive layer in gate region 35.

The combination of refractory metal layer 32 and metal layer 33 to form a conductive layer serves two functions. First they serve as gate structure 35 for semiconductor device 10, and secondly they act as the first level of metal interconnect for a circuit incorporating semiconductor device 10. The present invention therefore, obviates the need to perform process steps to form a contact between a gate structure and a first layer of metal which is required in previously known methods for forming a semiconductor device. The present invention eliminates the need for an additional deposition, photo masking, and etch step to form this contact. The resulting reduction in process steps will significantly reduce the final manufacturing cost of semiconductor device 10.

In the above mentioned discussion, ohmic contact regions 26 and 27 were formed prior to forming gate structure 35 which is a benefit rather than a requirement of the present invention. Many previously known techniques that do not form a sacrificial structure, form a final metalized gate structure prior to forming ohmic contacts to the source and drain regions. As a consequence, the material used to form the gate structure is subjected to RTA processing which can cause the gate material to diffuse into the substrate which will degrade the device performance. The present invention allows the flexibility to form ohmic contacts 26 and 27 either prior to or after forming gate structure 35.

By now it should be appreciated that the present invention provides a method for forming a semiconductor device 10 using a self-aligned process. Since spacers 16 and 17 remain and are used throughout the process flow, this method is immunized against mis-alignment of photo masks. The efficient use of spacers 16 and 17 results in a significant reduction in the number of process steps required which will reduce the manufacturing cost of semiconductor device 10. Since spacers 16 and 17 are used to form gate structure 35, there is no need to use a lift-off process to pattern the gate material, therefore the defect density of the process will be reduced and the yield of the final circuit will be increased. The present invention also provides the flexibility to form ohmic contact regions 26 and 27 prior to forming gate structure 35. This will prevent the gate material from diffusing into substrate 11 during the high temperature anneal steps associated with the formation of ohmic contacts 26 and 27. The use of aluminum nitride for first dielectric layer 13, also provides an unexpected device improvement in the leakage currents and breakdown voltage of semiconductor device 10. Since aluminum nitride is retained only over the critical device regions under spacers 16 and 17, problems with adhesion of aluminum nitride to the substrate 11 are obviated in this embodiment.

We claim:

1. A method for forming a self-aligned semiconductor device comprising the steps of:
   forming a first dielectric layer overlying a semiconductor substrate;
   forming a first spacer and a second spacer on the first dielectric layer, wherein a gate region is defined between the first spacer and the second spacer over the semiconductor substrate;
   forming a source region and a drain region after the step of forming the first spacer and the second spacer;
   forming a second dielectric layer overlying the semiconductor substrate and overlying the first spacer and the second spacer, including the gate region;
   removing portions of the second dielectric layer from the gate region; and
   forming a gate structure in the gate region.

2. The method for forming a self-aligned semiconductor device of claim 1, wherein the step of forming the first spacer and the second spacer further comprises the steps of:
   forming a sacrificial structure overlying the first dielectric layer;
   forming a third dielectric layer overlying the sacrificial structure; and
   removing portions of the third dielectric layer, and wherein the first spacer and the second spacer are formed juxtaposed to the sacrificial structure.

3. The method for forming a self-aligned semiconductor device of claim 2 further comprising the step of removing the sacrificial structure.

4. The method for forming a self-aligned semiconductor device of claim 1, wherein the step of forming the first spacer and the second spacer further comprises the steps of:
   forming a third dielectric layer overlying the first dielectric layer;
   forming an etch block layer overlying the third dielectric layer, wherein the etch block layer forms exposed portions of the third dielectric layer; and
   removing exposed portions of the third dielectric layer.

5. The method for forming a self-aligned semiconductor device of claim 4, wherein the step of forming an etch block layer overlying the third dielectric layer comprises the step of forming a photoresist layer which has been exposed and developed.

6. The method for forming a self-aligned semiconductor device of claim 1, wherein the step of forming a gate structure in the gate region further comprises the steps of:
   forming a conductive layer overlying the semiconductor substrate;
   patterning the conductive layer with an etch block layer such that there are exposed portions of the conductive layer; and
   removing the exposed portions of the conductive layer.

7. The method for forming a self-aligned semiconductor device of claim 1, wherein the step of forming a gate structure in the gate region further comprises the steps of:
   forming a lift-off layer overlying the second dielectric layer including in the gate region;
   removing the lift-off layer in the gate region;
   forming a conductive layer overlying the lift-off layer including in the gate region; and
   removing the lift-off layer such that the conductive layer is removed except in the gate region.

8. The method for forming a self-aligned semiconductor device of claim 1, wherein the step of forming the first dielectric layer uses a material selected from the group consisting of silicon dioxide, silicon nitride, and aluminum nitride.

9. The method for forming a self-aligned semiconductor device of claim 1, wherein the first dielectric layer is 100 angstroms to 1000 angstroms thick.

10. A method for forming a semiconductor device comprising the steps of:
    forming a first dielectric layer overlying a body of semiconductor material;
    forming a sacrificial structure having a first side and a second side on the first dielectric layer;
    forming a first spacer adjacent to the first side and a second spacer adjacent to the second side;
    removing the sacrificial structure;
    forming a second dielectric layer overlying the body of semiconductor material including the first spacer and the second spacer and a region between the first spacer and the second spacer;
    removing a portion of the second dielectric layer from the region between the first spacer and the second spacer; and
    forming a gate structure in the region between the first spacer and the second spacer.

11. The method for forming a semiconductor device of claim 10, wherein the first dielectric layer is 100 angstroms to 1000 angstroms thick.

12. The method for forming a semiconductor device of claim 10, wherein the step of forming the first dielectric layer uses a material selected from the group consisting of silicon dioxide, silicon nitride, and aluminum nitride.

13. The method for forming a semiconductor device of claim 10, wherein the step of forming a gate structure in the region between the first spacer and the second spacer further comprises the steps of:

forming a lift off layer overlying the second dielectric layer;

removing the lift off layer in the region between the first spacer and the second spacer;

forming a conductive layer overlying the lift off layer; and removing the lift off layer such that the conductive layer is removed except a portion in the region between the first spacer and the second spacer.

14. The method for forming a semiconductor device of claim 10, wherein the step of forming a gate structure in the region between the first spacer and the second spacer further comprises the steps of:

forming a conductive layer overlying the body of semiconductor material;

patterning the conductive layer with an etch block layer such that there are exposed portions of the conductive layer; and removing the exposed portions of the conductive layer.

15. A method for forming a semiconductor device comprising the steps of:

providing a semiconductor substrate;

forming a first dielectric layer overlying the semiconductor substrate, wherein the first dielectric layer is about 100 angstroms to 1000 angstroms thick;

forming a second dielectric layer on the first dielectric layer;

patterning the second dielectric layer;

forming a third dielectric layer on remaining portions of the second dielectric layer, wherein the third dielectric layer is an inorganic material; and removing portions of the third dielectric layer to form spacers.

16. The method for forming a semiconductor device of claim 15, wherein the step of forming the first dielectric layer uses a material selected from the group consisting of silicon dioxide, silicon nitride, and aluminum nitride.

17. The method for forming a semiconductor device of claim 15 further comprising the steps of:

forming a fourth dielectric layer overlying the spacers and between the spacers;

removing a portion of the fourth dielectric layer between the spacers;

forming a conductive layer overlying the fourth dielectric layer;

patterning the conductive layer with an etch block layer such that there are exposed portions of the conductive layer; and removing the exposed portions of the conductive layer.

18. The method for forming a semiconductor device of claim 15 further comprising the steps of:

forming a fourth dielectric layer overlying the semiconductor substrate including overlying the spacers and a region between the spacers;

removing a portion of the fourth dielectric layer from the region between the spacers;

forming a lift off layer overlying the fourth dielectric layer and in the region between the spacers;

removing the lift off layer from the region between the spacers;

forming a conductive layer overlying the lift off layer; and removing the lift off layer such that the conductive layer is removed except the portion in the region between the spacers.

* * * * *